(12) United States Patent
Hua et al.

(10) Patent No.: US 7,064,077 B2
(45) Date of Patent: Jun. 20, 2006

(54) METHOD FOR HIGH ASPECT RATIO HDP CVD GAPFILL

(75) Inventors: Zhong Qiang Hua, Saratoga, CA (US); Dong Qing Li, Santa Clara, CA (US); Zhengquan Tan, Cupertino, CA (US); Zhuang Li, San Jose, CA (US); Michael Chiu Kwan, Redwood City, CA (US); Bruno Geoffrion, San Jose, CA (US); Padmanabhan Krishnaraj, San Francisco, CA (US)

(73) Assignee: Applied Materials, Santa Clara, CA (US)

( * ) Notice: Subject to any disclaimer, the term of this patent is extended or adjusted under 35 U.S.C. 154(b) by 0 days.

(21) Appl. No.: 10/956,469

(22) Filed: Oct. 1, 2004

(65) Prior Publication Data

US 2005/0079715 A1    Apr. 14, 2005

Related U.S. Application Data

(63) Continuation of application No. 10/137,132, filed on Apr. 30, 2002, now Pat. No. 6,812,153.

(51) Int. Cl.
*H01L 21/302* (2006.01)

(52) U.S. Cl. ............... 438/715; 438/706; 438/714; 427/569

(58) Field of Classification Search ............ 438/706, 438/710, 712, 720, 714, 715; 427/569, 574
See application file for complete search history.

(56) References Cited

U.S. PATENT DOCUMENTS

| | | | |
|---|---|---|---|
| 4,690,746 A | 9/1987 | McInerney et al. | |
| 4,737,379 A | 4/1988 | Hudgens et al. | |
| 4,835,005 A | 5/1989 | Hirooka et al. | |
| 4,890,575 A | 1/1990 | Ito et al. | |
| 5,645,645 A | 7/1997 | Zhang et al. | |
| 5,712,185 A | 1/1998 | Tsai et al. | |
| 5,719,085 A | 2/1998 | Moon et al. | |
| 5,804,259 A | 9/1998 | Robles | |
| 5,872,058 A | 2/1999 | Van Cleemput et al. | |
| 5,910,342 A | 6/1999 | Hirooka et al. | |
| 5,913,140 A | 6/1999 | Roche et al. | |
| 5,976,327 A | 11/1999 | Tanaka | |

(Continued)

FOREIGN PATENT DOCUMENTS

GB    2 267 291 A    12/1993

(Continued)

OTHER PUBLICATIONS

S.V. Nguyen, "High-Density Plasma Chemical Vapor Deposition of Silicon-Based Dielectric Films for Integrated Circuits," *Journal of Research and Development*, vol. 43, 1/2 (1999).

(Continued)

*Primary Examiner*—Lan Vinh
(74) *Attorney, Agent, or Firm*—Townsend Townsend Crew, LLP

(57) ABSTRACT

A method of depositing a high density plasma silicon oxide layer having improved gapfill capabilities. In one embodiment the method includes flowing a process gas consisting of a silicon-containing source, an oxygen-containing source and helium into a substrate processing chamber and forming a plasma from the process gas. The ratio of the flow rate of the helium with respect to the combined flow rate of the silicon source and oxygen source is between 0.5:1 and 3.0:1 inclusive. In one particular embodiment, the process gas consists of monosilane ($SiH_4$), molecular oxygen ($O_2$) and helium.

20 Claims, 5 Drawing Sheets

U.S. PATENT DOCUMENTS

| | | | |
|---|---|---|---|
| 5,990,013 A | 11/1999 | Berenguer et al. | |
| 6,013,191 A | 1/2000 | Nasser-Faili et al. | |
| 6,013,584 A | 1/2000 | M'Saad | |
| 6,030,666 A * | 2/2000 | Lam et al. | 427/539 |
| 6,030,881 A | 2/2000 | Papasouliotis et al. | |
| 6,039,851 A | 3/2000 | Iyer | |
| 6,070,551 A | 6/2000 | Li et al. | |
| 6,184,158 B1 * | 2/2001 | Shufflebotham et al. | 438/788 |
| 6,194,038 B1 | 2/2001 | Rossman | |
| 6,217,658 B1 | 4/2001 | Orczyk et al. | |
| 6,228,751 B1 | 5/2001 | Yamazaki et al. | |
| 6,313,010 B1 | 11/2001 | Nag et al. | |
| 6,395,150 B1 | 5/2002 | Van Cleemput et al. | |
| 6,416,823 B1 | 7/2002 | Li et al. | |
| 6,559,026 B1 | 5/2003 | Rossman et al. | |
| 6,589,610 B1 | 7/2003 | Li et al. | |
| 6,596,654 B1 * | 7/2003 | Bayman et al. | 438/788 |
| 6,607,983 B1 | 8/2003 | Chun et al. | |
| 2003/0056900 A1 | 3/2003 | Li et al. | |

FOREIGN PATENT DOCUMENTS

| | | |
|---|---|---|
| JP | 2-58836 A | 2/1990 |
| JP | 7-161703 A | 6/1995 |

OTHER PUBLICATIONS

V.Y. Vassiliev et al., "Trends in Void-Free Pre-Metal CVD Dielectrics," *Solid State Technology*, pp. 129-139 (Mar. 2001).

Nalwa, H.S., *Handbook of Low and High Dielectric Constant Materials and Their Applications*, vol. 1, p. 66 (1999).

Meeks et al., "Modeling of SiO2 Deposition in High Density Plasma Reactors and Comparisons of Model Predictions With Experimental Measurements," J. Vac. Sci. Technol. A, 16(2), pp. 544-563 (1998).

* cited by examiner

METHOD FOR HIGH ASPECT RATIO HDP CVD GAPFILL

CROSS-REFERENCES TO RELATED APPLICATIONS

This application is a continuation of U.S. application Ser. No. 10/137,132, filed Apr. 30, 2002, now U.S. Pat. No. 6,812,153 entitled "METHOD FOR HIGH ASPECT RATIO HDP CVD GAPFILL," having Zhong Qiang Hua et al. listed as inventors. The 10/137,132 application is assigned to Applied Materials, Inc., the assignee of the present invention and is hereby incorporated by reference.

BACKGROUND OF THE INVENTION

One of the primary steps in the fabrication of modern semiconductor devices is the formation of a film, such as a silicon oxide, on a semiconductor substrate. Silicon oxide is widely used as an insulating layer in the manufacture of semiconductor devices. As is well known, a silicon oxide film can be deposited by thermal chemical vapor deposition (CVD) or a plasma chemical vapor deposition processes among other techniques. In a conventional thermal CVD process, reactive gases are supplied to the substrate surface where heat-induced chemical reactions (homogeneous or heterogeneous) take place to produce a desired film. In a conventional plasma process, a controlled plasma is formed to decompose and/or energize reactive species to produce the desired film.

Semiconductor device geometries have dramatically decreased in size since such devices were first introduced several decades ago. Smaller feature sizes have resulted in the presence of increased aspect ratio gaps for some applications, for example, between adjacent conductive lines or in etched trenches. The aspect ratio of a gap is defined by the ratio of the gap's height or depth to its width. These spaces are difficult to fill using conventional CVD methods. A film's ability to completely fill such gaps is referred to as the film's "gapfilling" ability. Silicon oxide is one type of insulation film that is commonly used to fill the gaps in intermetal dielectric (IMD) applications, premetal dielectric (PMD) applications and shallow trench isolation (STI) applications among others. Such a silicon oxide film is often referred to as a gapfill film or a gapfill layer.

Some integrated circuit manufacturers have turned to the use of high density plasma CVD (HDP-CVD) systems to deposit silicon oxide gapfill layers. HDP-CVD systems form a plasma that is approximately two orders of magnitude or greater than the density of a standard, capacitively-coupled plasma CVD system. Examples of HDP-CVD systems include inductively-coupled plasma systems and electron cyclotron resonance (ECR) plasma systems among others. HDP-CVD systems generally operate at lower pressure ranges than low density plasma systems. The low chamber pressure employed in HDP-CVD systems provides active species having a long mean-free-path and reduced angular distribution. These factors, in combination with the plasma's density, contribute to a significant number of constituents from the plasma reaching even the deepest portions of closely spaced gaps, providing a film with improved gapfill capabilities as compared to films deposited in a low density plasma CVD system.

Another factor that allows films deposited by HDP-CVD techniques to have improved gapfill characteristics as compared to films deposited by other CVD techniques is the occurrence of sputtering, promoted by the plasma's high density, simultaneous with film deposition. The sputtering element of HDP deposition slows deposition on certain features, such as the corners of raised surfaces, thereby contributing to the increased gapfill ability of HDP deposited films. Some HDP-CVD systems introduce argon or a similar heavy inert gas to further promote the sputtering effect. These HDP-CVD systems typically employ an electrode within the substrate support pedestal that enables the creation of an electric field to bias the plasma toward the substrate. The electric field can be applied throughout the HDP deposition process to generate sputtering and provide better gapfill characteristics for a given film.

One HDP-CVD process commonly used to deposit a silicon oxide film forms a plasma from a process gas that includes silane ($SiH_4$), molecular oxygen ($O_2$) and argon (Ar). The industry has found that silicon oxide film deposited according to such an HDP-CVD process are useful for a variety of applications and exhibit improved gapfill characteristics as compared to many other silicon oxide film deposition techniques that do not rely on HDP-CVD technology. Recently, however, engineers have discovered that for some high aspect ratio applications where the width of a gap to be filled is in the range of 0.13 microns or less, the addition of argon to the process gas actually hinders gapfill capabilities. FIGS. 1A–1C, which are simplified cross-sectional views of an HDP-CVD silicon oxide film at different stages of deposition, help illustrate this problem. The HDP-CVD film formed in FIGS. 1A–1C was deposited in a Ultima™ HDP-CVD chamber manufactured by Applied Materials, the assignee of the present application, using the process set forth below in Table 1 which was optimized for gapfill properties.

TABLE 1

PREVIOUSLY KNOWN HDP-CVD $SiO_2$ DEPOSITION PROCESS

| Parameter | Value |
| --- | --- |
| $SiH_4$ flow | 60 + 11 sccm |
| $O_2$ flow | 140 sccm |
| Ar flow | 80 + 12 sccm |
| Pressure | 2–4 mTorr (TVO) |
| Temperature | 550° C. |
| Top RF Power | 4900 Watts |
| Side RF Power | 3000 Watts |
| Bias RF Power | 2000 Watts |

For the gas flow entries within table 1 that include two numbers, the first number indicates the flow rate of the particular gas through side nozzles of the HDP-CVD apparatus while the second number indicates the flow rate of the gas through a top, centered nozzle. Also, TVO means "throttle valve fully open" which results in chamber pressure being controlled by the quantity of gas flowed into the chamber.

FIGS. 1A–1C, which are simplified cross-sectional views of a silicon oxide film at different stages of deposition, illustrate the potential gapfill limitation that is associated with the process recipe of Table 1 for certain small width gaps having relatively high aspect ratios. It is important to understand that while HDP-CVD silicon oxide deposition techniques generally provide for improved gapfill as compared to other plasma silicon oxide deposition techniques including low density, capacitively coupled plasma CVD techniques, the gapfill issues associated with those techniques become an issue for HDP-CVD techniques in certain aggressive gapfill applications, for example, gaps having a width of 0.10 μm and a 5:1 aspect ratio. The gapfill problem illustrated in FIGS. 1A–1C is not drawn to scale in order to more easily illustrate the problem.

FIG. 1A shows the initial stages of film deposition over a substrate (not shown) having a gap 120 defined by two adjacent features 122, 124 formed over the substrate. As shown in FIG. 1A, the conventional HDP-CVD silicon oxide deposition process results in direct silicon oxide deposition on horizontal surface 126 within gap 120 and horizontal surfaces 128 above features 122, 124. The process also results in indirect deposition (referred to as re-deposition) of silicon oxide on sidewalls 130 due to the recombination of material sputtered from the silicon oxide film as it grows. In certain small-width, high-aspect-ratio applications, the continued growth of the silicon oxide film results in formations 132 on the upper section gap sidewall that grow toward each other at a rate of growth exceeding the rate at which the film grows laterally on lower portions 134 of the sidewall (see FIG. 1B also). The final result of this process is that a void 136 forms as shown in FIG. 1C.

One method that semiconductor manufacturers have developed in order to address this issue is to remove the argon from the process gas altogether. Engineers at Applied Materials were able to develop an optimized $SiH_4$ and $O_2$ HDP-CVD process without argon that was able to adequately fill gaps having an aspect ratio of 5:1 and a width of only 0.15 microns. This $SiH_4$ and $O_2$ process, however, has so far proven to be inadequate at completely filling some even more aggressive gapfill applications.

Accordingly, despite the improvement in gapfill capabilities provided by HDP-CVD systems and the relatively good gapfill characteristics of HDP-CVD silicon oxide films in particular, the development of film deposition techniques that enable the deposition of silicon oxide layers having even further improved gapfill characteristics are desirable. Such improved silicon oxide film deposition are particularly desirable in light of the aggressive gapfill challenges presented by integrated circuit designs employing minimum feature sizes of 0.10 microns and less.

BRIEF SUMMARY OF THE INVENTION

Embodiments of the present invention pertain to a method and apparatus for depositing silicon oxide films having improved gapfill capabilities. Embodiments of the method of the invention deposit such films using HDP-CVD deposition techniques and are particularly useful for premetal dielectric and shallow trench isolation applications in the manufacture of integrated circuits having minimum feature sizes of 0.10 microns or less. As used herein, a high density plasma is a plasma having an ion density of at least $1 \times 10^{11}$ ions/cm$^3$.

In one embodiment, the method includes flowing a process gas consisting of a silicon-containing source, an oxygen-containing source and helium into a substrate processing chamber and forming a plasma from the process gas. The inventors have found that adding helium to the process gas instead of argon actually improves gapfill capabilities of the process at such small minimum features sizes. In order to achieve the improved gapfill capabilities, however, the inventors have found that is important to flow the helium source at a rate such that the ratio of the flow rate of helium with respect to the combined flow rate of the silicon source and oxygen source is at least 0.5:1. According to some embodiments of the invention, the ratio of the flow rate of helium with respect to the combined flow rate of the silicon source and oxygen source is between 0.5:1 to 3.0:1 inclusive. In one particular embodiment, the process gas consists of monosilane ($SiH_4$), molecular oxygen ($O_2$) and helium. Also, in some embodiments, the pressure level within the chamber is maintained at or below about 7 mTorr.

According to another embodiment, a method of forming a shallow trench isolation structure in a semiconductor substrate is disclosed. The method includes forming a silicon nitride layer over the substrate and etching a plurality of trenches in the substrate through the silicon nitride layer. Next, a silicon oxide layer is deposited over the substrate to fill the trenches by flowing a process gas consisting of a silicon source, an oxygen-containing source and helium into the substrate processing chamber and forming a high density plasma from said process gas. The ratio of a flow rate of the helium source to a combined flow rate of the silicon-containing source and the oxygen-containing source in the process gas is between 0.5:1 and 3.0:1 inclusive.

These and other embodiments of the present invention, as well as its advantages and features are described in more detail in conjunction with the text below and attached figures.

DETAILED DESCRIPTION OF THE INVENTION

I. INTRODUCTION

Embodiments of the present invention deposit a silicon oxide layer using high density plasma CVD techniques. The deposited layer has improved gapfill capabilities as compared to some prior art silicon oxide deposition techniques. Films deposited by the method of the present invention are particularly suitable for use in the fabrication of integrated circuits having feature sizes of 0.10 microns or less.

Embodiments of the present invention can be implemented using a variety of high density plasma CVD substrate processing chambers including chambers in which a plasma is formed by the application of RF energy to a coil that at least partially surrounds a portion of the chamber and chambers that use ECR plasma formation techniques. An example of an inductively-coupled HDP-CVD chamber in which embodiments of the method of the present invention can be practiced is set forth below.

II. EXEMPLARY SUBSTRATE PROCESSING SYSTEM

Figure 1A:
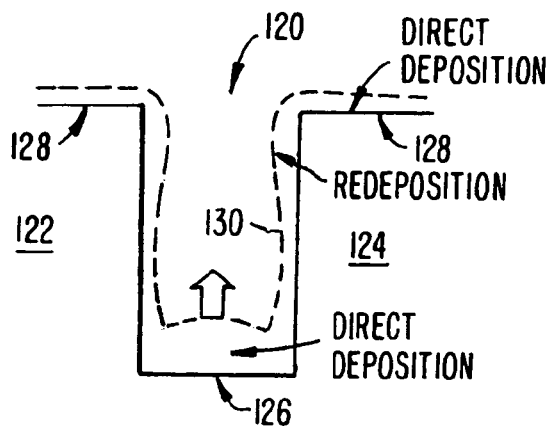
FIGS. 1A–1C are simplified cross-sectional views of an HDP-CVD silicon oxide film at different stages of deposition in a high aspect ratio gapfill application.
Figure 1B:
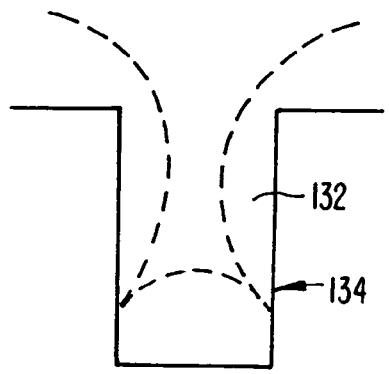
Figure 1C:
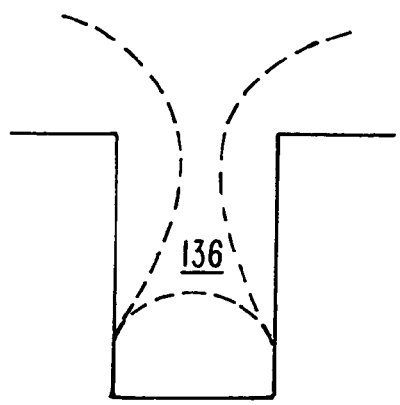
Figure 2A:
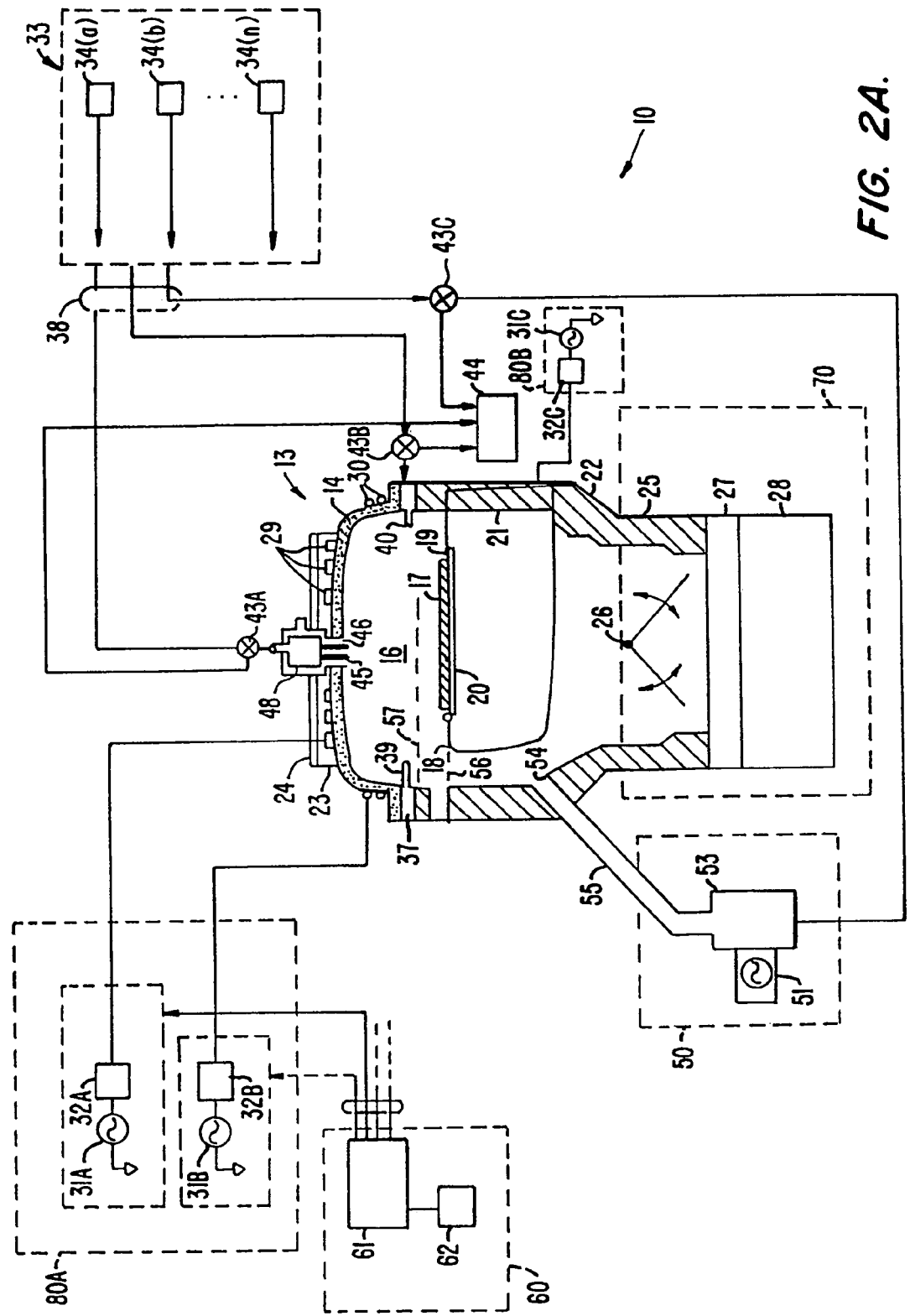
FIG. 2A is a simplified, cross-sectional view of an exemplary substrate processing system with which embodiments of the present invention may be used.

FIG. 2A illustrates one embodiment of a high density plasma chemical vapor deposition (HDP-CVD) system 10 in which a dielectric layer according to the present invention can be deposited. System 10 includes a chamber 13, a substrate support 18, a gas delivery system 33, a remote plasma cleaning system 50, a vacuum system 70, a source plasma system 80A, a bias plasma system 80B.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support 18, which is also made from an aluminum oxide or aluminum ceramic material.

A heater plate 23 and a cold plate 24 surmount, and are thermally coupled to, dome 14. Heater plate 23 and cold plate 24 allow control of the dome temperature to within about ±10° C. over a range of about 100° C. to 200° C. Generally, exposure to the plasma heats a substrate positioned on substrate support 18. Substrate support 18 includes inner and outer passages (not shown) that can deliver a heat transfer gas (sometimes referred to as a backside cooling gas) to the backside of the substrate.

The lower portion of chamber 13 includes a body member 22, which joins the chamber to the vacuum system. A base portion 21 of substrate support 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support 18. Substrate receiving portion 19 includes an electrostatic chuck 20 that can be used to secure the substrate to substrate support 18 during substrate processing.

Vacuum system 70 includes throttle body 25, which houses twin-blade throttle valve 26 and is attached to gate valve 27 and turbo-molecular pump 28. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures as low as about 1 mTorr.

Source plasma system 80A is coupled to a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. In a specific embodiment, the top source RF generator 31A provides up to 2,500 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

A gas delivery system 33 provides gases from several sources 34(a) . . . 34(n) via gas delivery lines 38 (only some of which are shown). In the particular example illustrated below, gas sources 34(a) . . . 34(n) include separate sources for $SiH_4$, $O_2$, Ar and $NF_3$ as well as one or more sources for the extended cleaning process. As would be understood by a person of skill in the art, the actual sources used for sources 34(a) . . . 34(n) and the actual connection of delivery lines 38 to chamber 13 varies depending on the deposition and cleaning processes executed within chamber 13. Gas flow from each source 34(a) . . . 34(n) is controlled by one or more mass flow controllers (not shown) as is known to those of skill in the art.

Figure 2B:
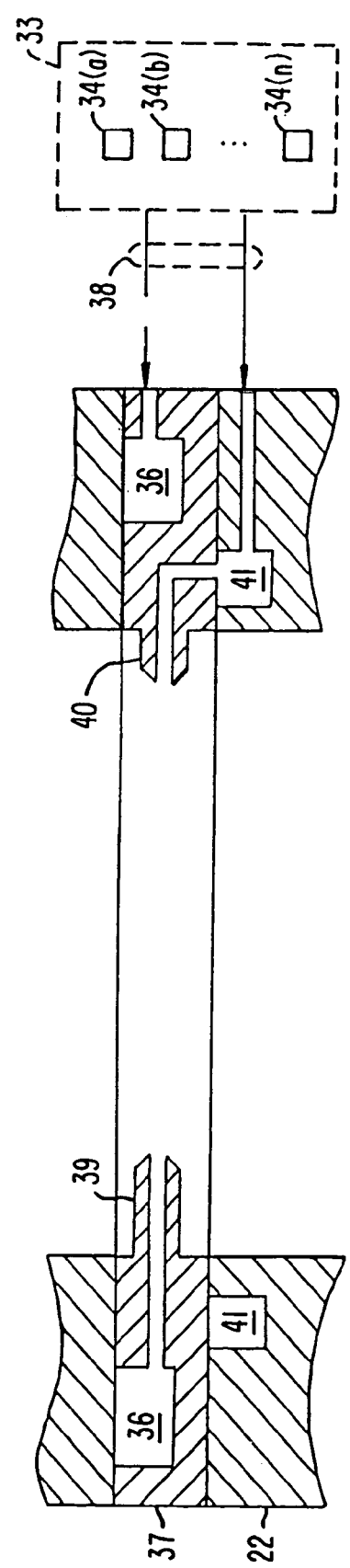
FIG. 2B is a simplified cross-sectional view of a gas ring that may be used in conjunction with the exemplary CVD processing chamber of FIG. 2A.

Gases are introduced into chamber 13 through a gas ring 37 and/or a top nozzle 45. FIG. 2B is a simplified, partial cross-sectional view of chamber 13 showing additional details of gas ring 37. In some embodiments, one or more gas sources provide gas to ring plenum 36 in gas ring 37 via gas delivery lines 38 (only some of which are shown). Gas ring 37 has a plurality of gas nozzles 39 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In one specific embodiment, gas ring 37 has 24 gas nozzles 39 made from an aluminum oxide ceramic.

Gas ring 37 also has a plurality of gas nozzles 40 (only one of which is shown), which in a specific embodiment are co-planar with and shorter than source gas nozzles 39, and in one embodiment receive gas from body plenum 41. Gas nozzles 39 and 40 are not fluidly coupled in some embodiments where it is desirable to not mix gases (e.g., $SiH_4$ and $O_2$) introduced through gas ring 37 before injecting the gases into chamber 13. In other embodiments, gases may be mixed prior to injecting the gases into chamber 13 by providing apertures (not shown) between body plenum 41 and gas ring plenum 36. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition or cleaning process. This may be accomplished using a 3-way valve, such as valve 43B, to isolate chamber 13 from a delivery line 38 and to vent delivery line 38 to vacuum foreline 44, for example. As shown in FIG. 2A, other similar valves, such as 43A and 43C, may be incorporated on other gas delivery lines. Such 3-way valves may be placed as close to chamber 13 and remote plasma source 50 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 2A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, one source, e.g., $SiH_4$, supplies source gas nozzles 39 and top nozzle 45 through separate MFCs (not shown). Similarly, separate MFCs may be used to control the flow of oxygen to both top vent 46 and gas nozzles 40 from a single source of oxygen. The gases supplied to top nozzle 45 and top vent 46 may be kept separate prior to flowing the gases into chamber 13, or the gases may be mixed in top plenum 48 before they flow into chamber 13. In other embodiments, separate sources of the same gas may be used to supply various portions of the chamber.

A remote microwave-generated plasma cleaning system 50 is provided to periodically clean deposition residues from chamber components in a dry cleaning operation. The cleaning system includes a remote microwave generator 51 that creates a plasma from one or more cleaning gas source in sources 34(*a*) . . . 34(*n*) (e.g., molecular fluorine, nitrogen trifluoride, other fluorocarbons or equivalents alone or in combination with another gas such as Argon) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

System controller 60 controls the operation of system 10. Controller 60 may include, for example, a memory 62, such as a hard disk drive and/or a floppy disk drive and a card rack coupled to a processor 61. The card rack may contain a single-board computer (SBC), analog and digital input/output boards, interface boards and stepper motor controller boards. System controller 60 operates under the control of a computer program stored on the hard disk drive or through other computer programs, such as programs stored on a removable disk. The computer program dictates, for example, the timing, mixture of gases, RF power levels and other parameters of a particular process.

III. DEPOSITING A SILICON OXIDE FILM ACCORDING TO SPECIFIC EMBODIMENTS OF THE INVENTION

Figure 3:
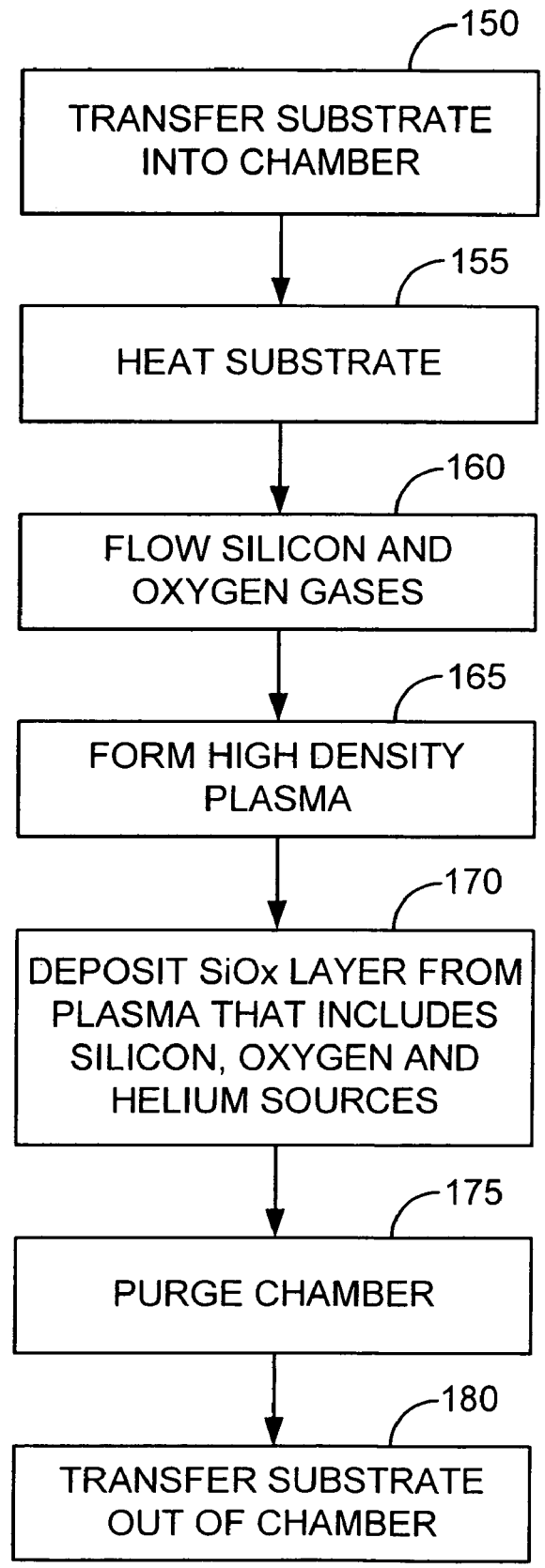
FIG. 3 is a flowchart illustrating the steps according to one embodiment of the present invention.

As previously stated, embodiments of the present invention can be practiced in an HDP-CVD chamber such as exemplary chamber 13 described above. For convenience, one particular embodiment of the invention is described with respect to FIG. 3. FIG. 3 is a flowchart illustrating various steps associated with the deposition of an undoped silicon oxide film (USG) according to one embodiment of the invention. The process is for exemplary purposes only and is not intended to limit the scope of the claims of the present invention. Where applicable, reference numbers in the description below are used to refer to appropriate components of the exemplary chamber of FIGS. 2A–2B. In this embodiment the process is implemented and controlled using a computer program stored in memory 62 of system controller 60.

Referring to FIG. 3 the substrate upon which an undoped silicon oxide layer is to be deposited according to the present invention is transferred into deposition chamber 13 (step 150). A flow of gas is then introduced into the chamber and a plasma is initiated to heat the substrate before deposition of the oxide film begins (step 155). Typically this heating step uses source RF power only (no bias RF power) in order to ensure the underlying substrate features are not sputtered. The substrate is typically heated to a temperature above 500° C. during step 155 but can be heated to even higher temperatures in some embodiments. In some embodiments, a heater within the chamber, e.g., within the substrate support pedestal, can be used in addition to or instead of the plasma to the substrate in step 155.

Typically the gas used to heat the substrate in step 155 does not include silicon. In one particular embodiment, the substrate is heated by a plasma of argon and/or an oxygen source, such as $O_2$, for between approximately 60–120 seconds.

Next, the plasma is extinguished and a deposition process gas is flowed into the chamber in preparation for the film deposition step (step 160). The deposition process gas includes an oxygen source and a silicon source. In one embodiment the oxygen source is $O_2$ and the silicon source is a silane gas such as $SiH_4$. After the flow of the process gas has stabilized, high density a plasma is formed by applying RF power to side coil 30 and top coil (step 165). Power is also applied to chuck 20 to bias the plasma toward the substrate during step 155. In one particular embodiment, the plasma formed in step 165 is formed in a multistep process in which bias power is applied to the chuck, then the substrate is chucked while power is applied to the top coil and then finally to the side coil.

The high density plasma is then maintained to deposit the silicon oxide film over the substrate (step 170). As previously stated, embodiments of the invention add a flow of helium to the process gas during step 170. In one embodiment, the flow of helium is added to the process gas in step 170 while in other embodiments the helium may be added in step 160 or 165.

The inventors have discovered that using helium in the HDP silicon oxide deposition process instead of argon may increase the gapfill capabilities of the silicon oxide film. Helium, which is the second lightest element in the periodic table, causes very limited sputtering during the deposition process which is the primary source of sidewall redeposition. Helium is also characterized with its chemical inertness, high mobility and the highest ionization energy of its family (24.6 eV versus 15.8 eV for argon for the first degree of ionization) in a high density plasma. While not being limited to any particular theory, the inventors believe that the high mobility of helium, when introduced in sufficient quantities, along with its long residence time limits redeposition on the gap sidewalls. The inventors theorize that when helium enters the trench because of its long residence time it can stay on the sidewall for relatively long periods of time thereby preventing other material from contacting and adhering to the sidewall. The inventors also theorize that helium may improve gapfill by increasing the gas electron temperature thereby promoting a higher density plasma, which in turn allows silane and oxygen to become more easily ionized, and more ion directionality. By increasing ion directionality and limiting sidewall redeposition, the deposition of the film within the gap is accelerated from the bottom up as opposed from the sidewall in resulting in improved gapfill.

The inventors have found that in order to achieve improved gapfill by adding helium to the process, it is important to flow a relatively high amount of helium into the chamber along with the silicon and oxygen sources. To this end, the ratio of the flow rate of the helium source to the combined flow rates of the oxygen and silicon sources should be at least 0.5 to 1. At ratios below 0.5:1 the benefits of helium and improved gapfill are not seen.

In some embodiments where an average silane flow (e.g., between 40–60 sccm) is used, the ratio of the flow rate of the helium source to the combined flow rates of the oxygen and silicon sources is preferably less than 3.0:1. When an average silane flow is used, the relatively high gas flow rates required to achieve ratios of helium to oxygen and silicon sources above 3.0:1 increases the chamber pressure to undesirably high levels which in turn degrades film gapfill capabilities suppressing and even overriding the benefits obtained by the addition of helium to the process gas. In other embodiments having an average silane flow rate, the ratio of helium flow rate to silane and oxygen flow rates is between 1.5 and 2.5 to 1.

In still other embodiments though, where the rate at which silane is introduced into the chamber is relatively low (e.g., between 15–30 sccm), the helium to oxygen and silicon sources ratio may be considerably higher than 3.0:1. For example, in some embodiments, the ratio can be 10:1 or higher. Reducing the flow rate of silane gas reduces the overall deposition rate of the silicon oxide film. Embodiments of the invention are able to deposit a silicon oxide film at a rate of between about 2500 to 3500 Å at average silane flow rates and at a rate of between about 1500 to 2100 Å at relatively low silane flow rates. Also, some embodiments of the invention employ an oxygen to silane ratio of between 1.5–2.0:1 inclusive.

Various embodiments of the invention maintain pressure within the chamber during step 120 at a level of 7 mTorr or less and preferably at a pressure of 5 mTorr or less. Such relatively low pressure levels are improve gapfill results by increasing the mean free path of ions and dissociated species thereby increasing the probability that such dissociated species will travel to the bottom of the trenches to assist in a bottom-up deposition process. Pressure levels can be kept at a minimum level in some embodiments by fully opening the throttle valve so that chamber pressure is controlled primarily by the flow rate of the process gas. Exemplary flow rates for the $SiH_4$, $O_2$ and He sources for some embodiments are listed in Table 2 set forth below.

TABLE 2

EXEMPLARY PROCESS GAS FLOWS

| | |
|---|---|
| Total $SiH_4$ flow | 39–90 sccm |
| Total $O_2$ flow | 45–150 sccm |
| Total He flow | 100–400 sccm |

After film deposition is complete, the flow of the silicon source is stopped, the substrate is dechucked and the plasma is continued for a brief time without bias power to purge the chamber (step 175). In some embodiments, only oxygen is flowed into chamber 13 during plasma purge step 175. Other embodiments include helium or argon in the plasma. Finally, all gas flows are stopped and the substrate is transferred out of the chamber (step 180).

The method of the present invention is particularly useful for the deposition of undoped silicon oxide layers for PMD and STI applications. Each of these applications often involve gapfill requirements that are more aggressive, i.e., higher aspect ratio gaps, than IMD applications. Thus, the deposition process of many embodiments of the invention occurs at a substrate temperature above 450° C. and more typically between 500° C. and 750° C. In embodiments of the invention used for IMD applications, the substrate temperature is kept below 450° C.

Figure 4:
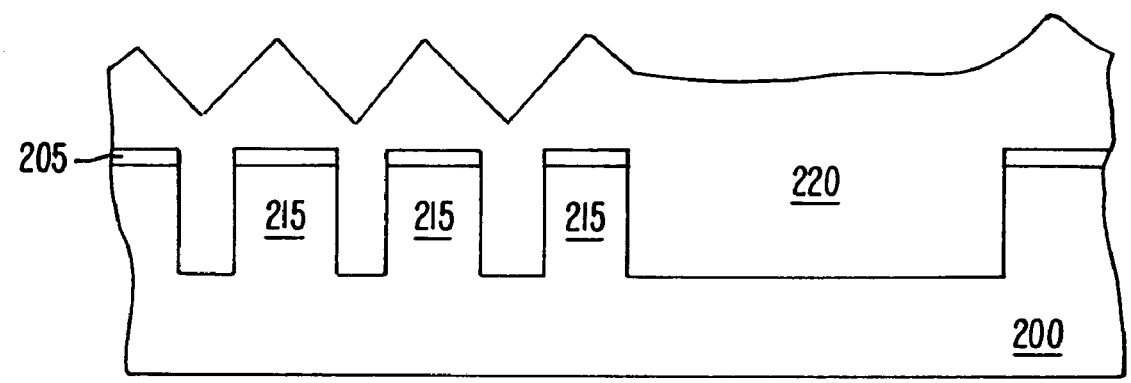
FIG. 4 is a simplified cross-sectional view of a shallow trench isolation (STI) structure formed in a semiconductor substrate 200 according to the process of FIG. 3.

FIG. 4 is a simplified cross-sectional view of a shallow trench isolation (STI) structure formed in a semiconductor substrate 200 that includes the USG film deposited according to the process of FIG. 3. The STI structure shown in FIG. 4 includes a thin silicon nitride cap layer 205 formed over raised surfaces 215 that define the trenches. A silicon oxide layer 220, deposited according to the present invention, fills the trenches so that, preferably, no gap exists between adjacent raised surfaces.

In order to prove the effectiveness of the present invention, the inventors performed tests comparing the gapfill capabilities of films deposited according to the present invention with films deposited using the prior art gapfill process shown in Table 1. These tests deposited undoped silicon oxide films over a silicon substrate having a plurality of gaps having a width of 1.0 micron and an aspect ratio of 5:1 (ratio of height to width) etched therein. Table 3 set forth below shows the deposition conditions used to test the method of the present invention. As with Table 1, when two numbers are listed for a gas flow variable, the first number is the flow from the side gas nozzle and the second number is the flow from the top gas nozzle.

TABLE 3

ONE EMBODIMENT OF THE INVENTION

| Parameter | Value |
|---|---|
| $SiH_4$ flow | 40 + 19 sccm |
| $O_2$ flow | 83 sccm |
| He flow | 250 sccm |
| Pressure | 2–4 mTorr (TVO) |
| Temperature | >500° C. |
| Top RF | 6500 Watts |
| Side RF | 6500 Watts |
| Bias RF | 2150 Watts |

As a result of these tests, the inventors found that films deposited according to the process shown in Table 3 completely filled the high aspect ratio gaps while the films deposited according to the process shown in Table 1 left voids in the gaps.

The process parameters set forth above with respect to the experiments and different embodiments are optimized for particular deposition processes run in an Ultima™ HDP chamber manufactured by Applied Materials that is outfitted for 200 mm wafers. A person of ordinary skill in the art will recognize that these preferred parameters are in part chamber specific and will vary if chambers of other design and/or volume are employed.

Also, the parameters listed in the above embodiments and the above-described experiments should not be limiting to the claims as described herein. One of ordinary skill in the art can also use parameters and conditions other than those described with respect to specific embodiments. For example, while the invention described with respect to an undoped silicate glass layer, the invention can also be used to improve the gapfill capabilities of phosphosilicate glass (PSG), boron-doped silicate glass (BSG) and boron phosphosilicate glass (BPGS) layers as well. For such films, a dopant gas such as $PH_3$ and/or $B_2H_6$ is added to the process gas in step 170. Also, in other embodiments, an oxygen source such as $N_2O$ or $CO_2$ can be used instead of $O_2$. As such, the above description is illustrative and not restrictive. The scope of the invention should, therefore, be determined not with reference to the above description, but instead should be determined with reference to the appended claims along with their full scope of equivalents.

What is claimed is:

1. A method for forming a silicon oxide layer over a substrate disposed in a high density plasma substrate processing chamber having a coil operatively coupled to form a plasma within the chamber and bias plasma system, said method comprising:
    heating the substrate to a temperature of at least 500° C. by introducing a first gas consisting of argon and/or an oxygen-containing source either alone or in combination into the substrate processing chamber and applying RF energy to the coil to form a plasma from the first gas without biasing the plasma toward the substrate;
    thereafter, flowing a process gas consisting of a silicon containing source, an oxygen-containing source, helium and optionally a dopant source into the substrate processing chamber, wherein a ratio of a flow rate of said helium to a combined flow rate of said silicon-containing source and said oxygen-containing source is at least 0.5:1; and
    applying RF energy to the coil to form a plasma from said process gas in order to deposit said silicon oxide layer, wherein said plasma has an ion density of at least $1.0 \times 10^{11}$ ions/cm$^3$.

2. The method of claim 1 wherein said silicon-containing source comprises monosilane ($SiH_4$).

3. The method of claim 2 wherein said oxygen-containing source comprises molecular oxygen ($O_2$).

4. The method of claim 3 wherein a ratio of said flow rate of said helium to a combined flow rate of said $SiH_4$ and said $O_2$ is between 1.5:1 and 2.5:1 inclusive.

5. The method of claim 4 wherein the oxide layer is deposited over a trench having a width of 0.1 µm or less and an aspect ratio of 5:1 or higher.

6. The method of claim 1 wherein a pressure level within the chamber is less than 7 mTorr during deposition of the silicon oxide layer.

7. The method of claim 6 wherein a ratio of said flow rate of said helium to a combined flow rate of said $SiH_4$ and said $O_2$ is between 0.5:1 and 3.0:1 inclusive.

8. A method for forming a silicon oxide layer over a substrate, the method comprising:
    heating the substrate to a temperature of at least 500° C. by introducing a first gas consisting of an inert gas and/or an oxygen-containing source either along or in combination into the substrate processing chamber and applying RF energy to a coil operatively coupled to the chamber to form a plasma from the first gas without biasing the plasma toward the substrate;
    thereafter, depositing the silicon oxide layer over the substrate by flowing a process gas comprising a silicon source, an oxygen source and helium into the substrate processing chamber, applying RF energy to the coil to form a high density plasma from the process gas and biasing the high density plasma toward the substrate.

9. The method set forth in claim 8 wherein the inert gas in the first gas comprises argon.

10. The method set forth in claim 8 wherein the process gas consists essentially of a silicon source, an oxygen source, helium and an optional dopant source.

11. The method set forth in claim 8 wherein the process gas comprises a first flow of the silicon source that is introduced into the chamber from positions around the periphery of the substrate and a second flow of the silicon source that is introduced into the chamber from a position above the substrate.

12. The method set forth in claim 11 wherein the helium flow in the process gas is introduced into the chamber from positions around the periphery of the substrate.

13. The method set forth in claim 12 wherein the silicon source comprises monosilane ($SiH_4$) and the oxygen source comprises molecular oxygen ($O_2$).

14. The method set forth in claim 8 wherein the substrate is chucked to a substrate support during deposition of the silicon oxide layer and further comprising:
    after depositing the silicon oxide layer, dechucking the substrate from the substrate support while maintaining the plasma without biasing the plasma toward the substrate prior to stopping all the gas flow into the chamber and transferring the substrate out of the chamber.

15. The method set forth in claim 10 wherein the process gas comprises a first flow of the silicon source that is introduced into the chamber from positions around the periphery of the substrate and a second flow of the silicon source that is introduced into the chamber from a position over the substrate.

16. The method set forth in claim 15 wherein the helium flow in the process gas is introduced into the chamber from positions around the periphery of the substrate.

17. The method set forth in claim 15 wherein a ratio of the flow rate of helium to the combined flow rates of silicon and oxygen is higher than 3:1.

18. The method set forth in claim 1 wherein a ratio of the flow rate of helium to the combined flow rates of silicon and oxygen is higher than 10:1.

19. The method set forth in claim 1 wherein the process gas comprises a first flow of the silicon source that is introduced into the chamber from positions around the periphery of the substrate and a second flow of the silicon source that is introduced into the chamber from a position over the substrate.

20. The method set forth in claim 19 wherein the helium flow in the process gas is introduced into the chamber from positions around the periphery of the substrate.

* * * * *